US009741480B2

(12) United States Patent
Lakrimi et al.

(10) Patent No.: US 9,741,480 B2
(45) Date of Patent: Aug. 22, 2017

(54) MECHANICAL SUPERCONDUCTING SWITCH

(71) Applicant: SIEMENS PLC, Frimley, Camberley (GB)

(72) Inventors: M'Hamed Lakrimi, Oxfordshire (GB); Adrian Mark Thomas, Oxon (GB)

(73) Assignee: Siemens Healthcare Limited, Frimley, Camberley (GB)

( * ) Notice: Subject to any disclaimer, the term of this patent is extended or adjusted under 35 U.S.C. 154(b) by 0 days.

(21) Appl. No.: 14/375,566

(22) PCT Filed: Jan. 18, 2013

(86) PCT No.: PCT/EP2013/050992
§ 371 (c)(1),
(2) Date: Jul. 30, 2014

(87) PCT Pub. No.: WO2013/113573
PCT Pub. Date: Aug. 8, 2013

(65) Prior Publication Data

US 2015/0018218 A1 Jan. 15, 2015

(30) Foreign Application Priority Data

Feb. 2, 2012 (GB) .................................. 1201818.0

(51) Int. Cl.
*H01F 6/00* (2006.01)
*H01F 6/06* (2006.01)
(Continued)

(52) U.S. Cl.
CPC ............... *H01F 6/06* (2013.01); *H01F 6/008* (2013.01); *H01F 6/04* (2013.01); *H01H 33/004* (2013.01)

(58) Field of Classification Search
CPC .................................... H01F 6/06; H01F 6/04
(Continued)

(56) References Cited

U.S. PATENT DOCUMENTS 3,551,861 A * 12/1970 Boom .................. H01H 33/004 200/262
3,596,349 A * 8/1971 Boom .................... H01B 12/08 174/125.1
(Continued)

FOREIGN PATENT DOCUMENTS

CH 101170025 4/2008
GB 1147669 4/1969
(Continued)

OTHER PUBLICATIONS

Ohtsuka et al., "Magnetic Field Dependence of Transition Current of NbTi Mechanical PCS," Cryogenics, vol. 38 (1998) pp. 1207-1212.
(Continued)

*Primary Examiner* — Shawki S Ismail
*Assistant Examiner* — Lisa Homza
(74) *Attorney, Agent, or Firm* — Schiff Hardin LLP

(57) ABSTRACT

A mechanically operating superconducting switch has two superconducting wires, a respective end of each superconducting wire being embedded in a respective block of superconducting material. A mechanical arrangement is provided for driving respective contact surfaces of the blocks into physical contact with each other, and for separating those services.

15 Claims, 4 Drawing Sheets

(51) Int. Cl.
*H01H 33/00* (2006.01)
*H01F 6/04* (2006.01)

(58) Field of Classification Search
USPC .......................................................... 335/216
See application file for complete search history.

(56) References Cited

U.S. PATENT DOCUMENTS

| | | | | |
|---|---|---|---|---|
| 4,001,738 | A * | 1/1977 | Terracol | H01H 77/108 335/147 |
| 4,021,633 | A * | 5/1977 | Kuwabara | H01H 33/004 200/262 |
| 4,024,363 | A * | 5/1977 | Marsing | H01H 33/004 174/15.4 |
| 4,326,188 | A * | 4/1982 | Dahlberg | H01L 39/223 257/E39.014 |
| 4,635,015 | A * | 1/1987 | Franksen | H01H 33/004 174/125.1 |
| 4,654,491 | A * | 3/1987 | Maier | H01H 9/46 218/33 |
| 4,667,487 | A | 5/1987 | Miller et al. | |
| 4,689,439 | A * | 8/1987 | Sato | F25D 3/10 174/11 R |
| 4,982,571 | A * | 1/1991 | Marschik | H02H 7/001 174/15.4 |
| 5,532,638 | A | 7/1996 | Kubo et al. | |
| 5,982,179 | A | 11/1999 | Munsell et al. | |
| 6,133,814 | A * | 10/2000 | Okada | H01L 39/02 174/125.1 |
| 6,211,479 | B1 * | 4/2001 | Ohara | H01H 33/004 218/146 |
| 6,531,233 | B1 * | 3/2003 | Pourrahimi | H01L 39/02 428/107 |
| 6,677,751 | B1 | 1/2004 | Marek et al. | |
| 8,352,002 | B2 * | 1/2013 | Kawashima | F25D 19/006 174/15.4 |
| 2002/0190824 | A1 | 12/2002 | Tomita et al. | |
| 2007/0247263 | A1 * | 10/2007 | Calvert | G01R 33/3802 335/216 |
| 2008/0164877 | A1 * | 7/2008 | Huang | G01R 33/288 324/319 |
| 2009/0258788 | A1 * | 10/2009 | Miyazaki | C22C 9/02 505/510 |
| 2010/0148593 | A1 * | 6/2010 | Ohashi | H02K 55/02 310/10 |
| 2010/0148894 | A1 * | 6/2010 | Ohashi | H02K 55/02 335/216 |
| 2011/0012698 | A1 * | 1/2011 | Hutton | G01R 33/3802 335/216 |
| 2011/0025438 | A1 * | 2/2011 | Ohashi | H02K 55/02 335/216 |
| 2011/0028327 | A1 * | 2/2011 | Kodama | H01F 6/065 505/211 |
| 2011/0257017 | A1 * | 10/2011 | Park | G01R 33/3815 505/162 |
| 2012/0182012 | A1 * | 7/2012 | Lvovsky | G01R 33/3815 324/318 |
| 2014/0087950 | A1 * | 3/2014 | Isojima | H01L 39/16 505/163 |
| 2014/0103746 | A1 * | 4/2014 | Amiet | F41B 6/003 310/12.07 |
| 2014/0357491 | A1 * | 12/2014 | Nakagawa | H01F 6/06 505/163 |

FOREIGN PATENT DOCUMENTS

| | | |
|---|---|---|
| GB | 1174878 | 12/1969 |
| GB | 1 581 969 | 12/1980 |
| GB | 2481833 A | 1/2012 |
| JP | H0677542 A | 3/1994 |
| JP | 1993000133165 | 12/1994 |
| JP | H06350148 A | 12/1994 |
| JP | 1994000021304 | 8/1995 |
| JP | H10228933 A | 8/1998 |

OTHER PUBLICATIONS

Takayasu et al. “Negative-Resistance Voltage-Current Characteristics of Superconductor Contact Junctions for Macro-Scale Applications,” IEEE Trans. on Applied Superconductivity, vol. 13, No. 2 (2003) pp. 1648-1641.

Takayasu “Electric Characteristics of Contact Junctions Between NbTi Multifilamentary Wires,” IEEE Trans. on Applied Superconductivity, vol. 9, No. 3 (1999) pp. 4628-4632.

Ohtsuka et al. “Characteristics of NbTi Mechanical Persistent Current Switch and Mechanism of Superconducting Connection at Contact,” Cryogenics, vol. 38, (1998) pp. 893-902.

Siegwarth et al. “A Mechanical Superconducting Switch for Low Temperature Instrumentation,” Rev. Sci Instrum, vol. 43 (1972) pp. 153-154.

Kotowoski et al. “Superconducting Multicontact Rotary Switch,” Rev. Sci. Instrum. vol. 49, (1978) pp. 1363-1365.

Pavao, “Criticial Temperatures of Superconducting Solders,” Massachusetts Institute of Technology, Department of Mechanical Engineering, (2007).

* cited by examiner

MECHANICAL SUPERCONDUCTING SWITCH

BACKGROUND OF THE INVENTION

Field of the Invention

The present invention concerns a mechanical superconducting switch, in particular for a superconducting magnetic resonance imaging (MRI) magnet.

Description of the Prior Art

Superconducting MRI magnets are formed of several coils of superconducting wire electrically connected in series and conventionally housed within a cryostat with a cryogenic refrigerator which cools the magnet to below a superconducting transition temperature of the material of the coils.

Many conventional designs include a bath of liquid cryogen, for example liquid helium, which is maintained below its boiling point by a cryogenic refrigerator.

However, more recent designs have sought to reduce or eliminate consumption of cryogens such as helium, for example by using cooling loops or "dry" also referred to as cryogen free magnets in which no liquid cryogen is used.

It is necessary to provide a switch across the terminals of the series connection of coils. In one state (the "on" state), the switch should be superconducting, so as to complete a superconducting circuit through the coils so that current may flow persistently in the magnet. In another state (the "off" state), the switch should be resistive, to allow current to be introduced into, or removed from, the coils by a power supply unit connected to the magnet for the purpose. Conventionally, all superconducting switches require the fabrication of an ancillary superconducting coil used to effect the switching operation. The ancillary coil is typically formed of wire having a matrix typically made of a resistive CuNi alloy. This renders the switch susceptible to temperature and wire instabilities. The wire and filament size play an important role in the stability of the switch against flux jumping, in which a small quench in a single filament may propagate to the other filaments in the wire due to resistive dissipation in the matrix material carrying current between filaments.

Conventional superconducting switches have a limited open-circuit resistance and thus limit the achievable ramp rate and dissipate heat during energization and de-energization of the magnet. The conventional switches are opened and closed using a thermal heater in thermal contact with the ancillary superconducting coil. This heater contributes to heat load on the cryostat and heat dissipation. For example, a certain conventional design includes an ancillary coil with an "off" resistance of about 5-50Ω. This dissipates power during ramp up and during ramp down. The heaters themselves on the switch dissipate further energy during a ramp up or down. Such levels of heating are far in excess of the cooling power of a typical 4.2K cryogenic refrigerator. In cryostats with baths of liquid cryogen, the required cooling was provided by immersing the switch in the liquid bath.

The drive for dry magnets calls for a different approach to the superconducting switch as the cooling power at 4.2K is very limited, typically 1.2 W.

The following documents contain technical information relating to the background of the present invention:

Makoto Takayasu, Electric Characteristics of Contact Junctions Between NbTi Multifilamentary Wires, IEEE Transactions on Applied Superconductivity, Vol. 9, No. 3, September 1999.

Makoto Takayasu, Toshiaki Matsui, and Joseph V. Minervini, Negative-Resistance Voltage-Current Characteristics of Superconductor Contact Junctions for Macro-Scale Applications, IEEE Transactions on Applied Superconductivity, Vol. 13, No. 2, June 2003.

S. Ohtsuka, H. Ohtsubo, T. Nakamura, J. Suehiro, and M. Hara, Characteristics of NbTi mechanical persistent current switch and mechanism of superconducting connection at contact, Cryogenics 38 (1998) 1441-1444.

US2002/0190824 A1, dated Dec. 19, 2002: Persistent Current switch and method for the same.

JP7231125-A, CHODENDO MAGNET KK (CHOD-C); FURUKAWA ELECTRIC CO LTD (FURU-S) 1995-08-29, Persistent current switch examination method e.g. for magnetic-levitation train—involves letting circumference current and DC current flow along same direction to persistent current switch by second power supply lifted to both ends.

JP6350148-A, 1994-12-22, HITACHI LTD (HITA-S) Persistent current superconductive device for energy storage—incorporates superconducting wire, current lead and permanent current mechanical switch.

U.S. Pat. No. 5,532,638, dated Jul. 2, 1996, CHUBU DENRYOKU KK (CHUB-S); CHUBU ELECTRIC POWER CO (CHUB-S); HITACHI LTD (HITA-S), Superconductive energy storage device for the same.

E. M. Pavão, Critical Temperatures of Superconducting Solders. MIT. June 2007

CN100595856C. Chinese Academy of Science.

SUMMARY OF THE INVENTION

The present invention accordingly addresses the above-mentioned problems, and aims to provide a superconducting switch for use with a superconducting magnet which does not suffer from the problems of high heat dissipation and limited "off" resistance.

According to the present invention, no separate ancillary coil is required for the superconducting switch. Instead, the switch is made using wire ends of the coils forming the superconducting magnet itself. The switch of the present invention provides mechanically operating switch contacts to provide electrical conduction between the wire ends of the coils forming the superconducting magnet itself.

The superconducting wire used for the magnet coils typically has a copper matrix and thus offer better stability than CuNi matrix wires typical of conventional superconductor switches.

The switch opening and closing states uses a mechanical action and thus does not require a thermal heater and can have a practically infinite "off" resistance. This minimizes any heat dissipation and increases the achievable ramp rate for energizing and de-energizing the magnet. The cooling power of the cryogenic refrigerator is accordingly available for cooling the magnet and compensating for other thermal loads on the magnet.

In an example, the mechanical superconducting switch of the present invention may be constructed as follows.

The leadout wire from the "start" of the magnet coils is jointed onto itself or to another superconductor. By "jointed onto itself" is meant that superconducting filaments in the wire are exposed, are twisted, plaited or otherwise retained together and then treated as if a joint were being made to another superconducting wire, but only involving this single wire. In an example process, the filaments are tined with indium. Similarly, the leadout wire from the "end" of the magnet coils is also jointed onto itself. Optionally, another piece of superconducting wire may be interposed between the coil "start" or "end" and the joint.

The end of each leadout wire is then placed in a respective mold. BiPb or similar superconducting material with tolerable melting point is then poured into the mold, to form a block of superconducting material on the end of each leadout wire. The mechanical switch of the present invention operates by pressing these blocks into physical contact, and physically separating them. When the two blocks are brought together then the switch is closed and persistence of the magnet can be achieved, at an appropriate temperature. When the blocks are separated from one another, the switch is open and thus enabling energization or de-energization of the magnet.

According to an aspect of the present invention, the wires forming the start and end of the magnet are used to form the switch, or at least, wires of conventional construction are used. These wires are optimized for stability and performance and typically have a copper matrix which makes them very stable. The switch of the present invention avoids the need for special wire to manufacture a superconducting switch and relies on proven jointing technology.

Operation of switches according to the present invention has been demonstrated. In an example, a clamping torque of a few Newton-meters was used to press together BiPb blocks each containing NbTi filaments in a copper matrix. Persistence was demonstrated to better than $10^{-13}\Omega$ at 1000 A and under 1.2 T background field. This result is more than sufficient for use as superconducting switch in many conventional magnet arrangements. In other tests, with the clamping force only finger tight, persistence to better than $10^{-13}\Omega$ was achieved at 300 A at 0 T and 50 A under 0.8 T background field.

This is seen to be far superior to the result achieved by S. Ohtsuka, H. Ohtsubo, T. Nakamura, J. Suehiro, and M. Hara, *Characteristics of NbTi mechanical persistent current switch and mechanism of superconducting connection at contact, Cryogenics* 38 (1998) 1441-1444. There, in 0 T background field, using NbTi blocks, the authors achieved at best 20 A with a resistance of $10^{-9}\Omega$. With a contact resistance of 1 m$\Omega$, the authors achieved 200 A with a pressing force of greater than 400 N.

An external control arrangement will be required to control the opening of the switch, which will be positioned within the cryostat with the magnet. Control will need to be exercisable from outside the cryostat. Preferably, an electrically operated mechanism is used, with sealed current lead-throughs of conventional construction carrying the control signals into the cryostat. Alternatively, mechanical, hydraulic, pneumatic or piezoelectric arrangements, and similar, may be used.

The present invention accordingly provides a mechanically operated superconductor switch in which contacts are pressed together for producing a persistent circuit in superconducting devices, especially magnets. Preferably, at least one of the contacts is formed using a ductile superconducting material, such as BiPb, NbTi, Nb chemically or metallurgically joined to the main superconducting wire to be switched. The superconducting wire to be switched may itself include superconducting filaments of any suitable material, such as NbTi, $Nb_3Sn$, $MgB_2$, or high temperature superconductors.

The contacts, or at least the contact surfaces, may be housed in a vacuum or inert atmosphere to preserve surface conditions. The vacuum or inert atmosphere may be the operating environment of the magnet, or separately enclosed, preferably protecting contacts from contamination from the point of manufacture. A chemical getter such as carbon may be incorporated into the enclosure to aid preservation of the atmosphere.

BRIEF DESCRIPTION OF THE DRAWINGS

FIGS. 6 and 7 illustrate an example of a rotary-actuated mechanical superconducting switch according to the present invention, wherein FIG. 6 shows a partially cut-away cross-section along line VI-VI in FIG. 7.

DESCRIPTION OF THE PREFERRED EMBODIMENTS

Figure 1:
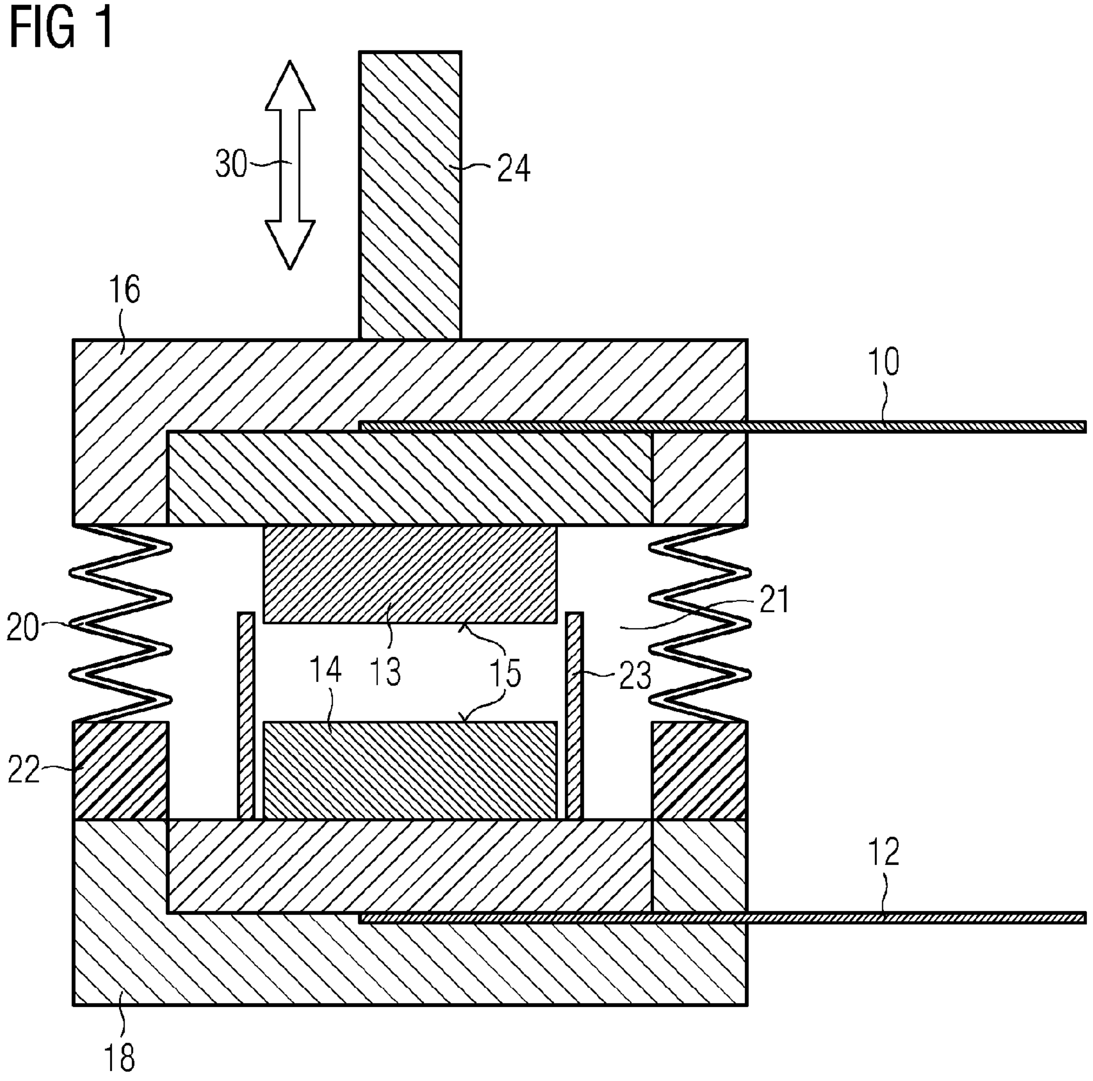
FIG. 1 shows an example of a linearly-actuated mechanical superconducting switch according to the present invention.

FIG. 1 shows a first example, in which superconducting wires 10, 12 are each embedded within upper 13 and lower 14 blocks of superconducting material, providing contact surfaces 15. Preferably, the material of at least one of the blocks is a ductile superconducting material, such as BiPb, NbTi, Nb. Upper 16 and lower 18 enclosure pieces retain the blocks and a bellows 20 provides a sealed enclosure 21 of variable height. An electrical insulator 22 may be provided if necessary, forming part of the enclosure, to prevent electrical conduction between the wires 10, 12 through the material of the enclosure. Mechanical actuation 30 may drive the contact surfaces 15 into electrical contact and separate them again. Although a mechanical actuator 24 is schematically illustrated, any appropriate means may be used to drive the two enclosure pieces 16, 18 toward one another and apart again to provide closing and opening of the switch. For example, a gas at a certain pressure may be sealed within enclosure 21, the enclosure itself being positioned within another vessel, which may contain gas at a pressure higher or lower than the certain pressure, in order to drive the contact surfaces 15 together or apart. An alignment tube 23 of electrically insulating material may be provided to guide upper 13 and lower 14 blocks into aligned contact with one another.

Figure 2:
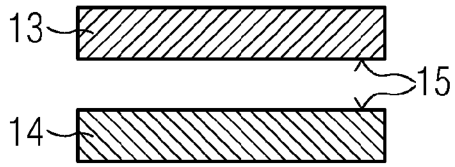
FIGS. 2-5 respectively show alternative versions of blocks with contact services, for different embodiments of the present invention.

FIG. 2 shows the upper 13 and lower 14 blocks of superconducting material, providing contact surfaces 15, in isolation.

Figure 3:
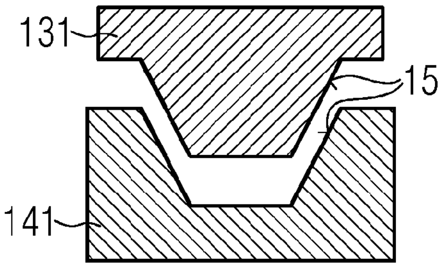

FIG. 3 shows a cross-section through a set of alternative upper 131 and lower 141 blocks of superconducting material. In this example, complementary frustoconical protrusions and recesses are provided on respective contact surfaces 15. If a force acting in the direction of arrow 30 is applied, the pressure acting between the conical contact surfaces will be rather higher than would be the case with planar contact surfaces, improving the electrical characteristics of the switch in its "on" position.

Figure 4:
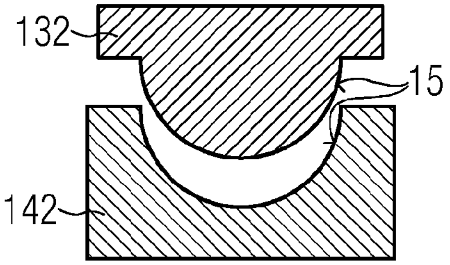

FIG. 4 shows a cross-section through a set of alternative upper 132 and lower 142 blocks of superconducting material. In this example, complementary part-spherical protrusions and recesses are provided on respective contact surfaces 15. If a force acting in the direction of arrow 30 is applied, the pressure acting between the part-spherical contact surfaces will be rather higher in certain places than would be the case with planar contact surfaces, improving the electrical characteristics of the switch in its "on" position. Other shapes of complementary recesses and protrusions may be provided as appropriate.

Figure 5:
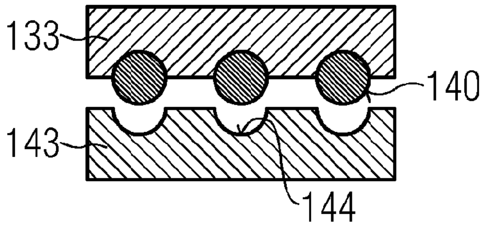

FIG. 5 shows a cross-section through a set of alternative upper 133 and lower 143 blocks of superconducting material. In this example, particles or beads 140 of a relatively hard superconducting material are included in at least one of the blocks 133. When blocks 133 and 143 are pressed together, for example by a force operating in the direction of arrow 30, these particles or beads 140 press into the more resilient material of the other block 143 producing corresponding cavities 144. The very high pressure acting at the points of contact between particles or beads 140 and block 143 ensures effective electrical contact.

Other similar arrangements may be devised by those skilled in the art, using the linear actuation arrangement shown in FIGS. 1-5.

Figure 6:
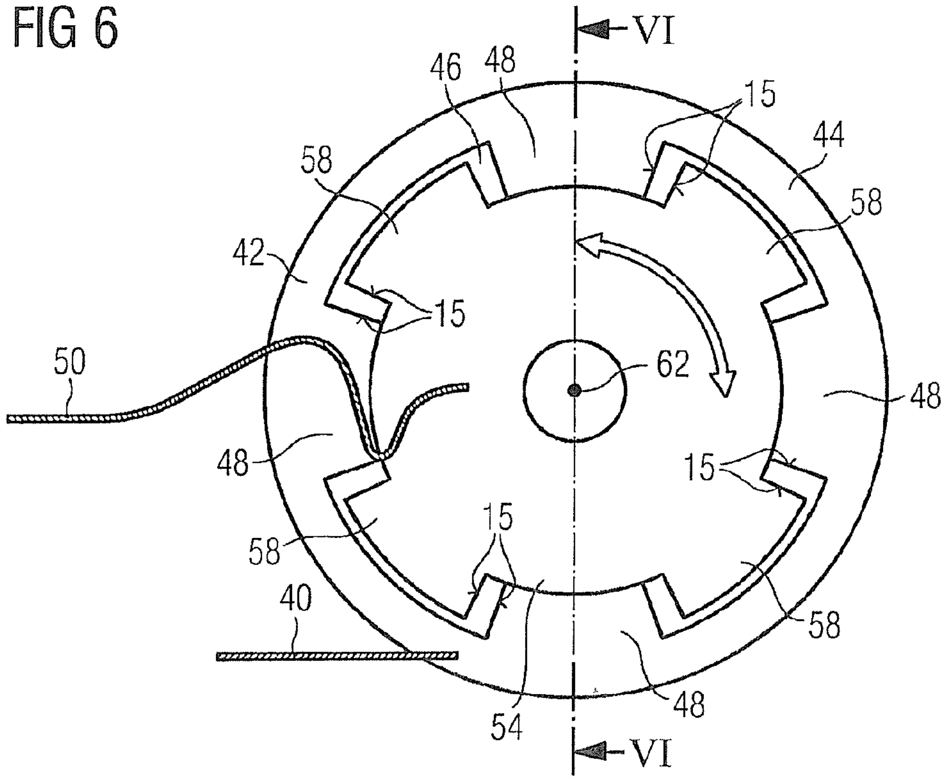

FIG. 6 illustrates another type of embodiment, in which rotational actuation may be employed. In this embodiment, a first superconducting wire 40 is embedded in a first block 42 of superconducting material. This block is of relatively complex shape, having an essentially cylindrical wall 44 with an essentially cylindrical cavity 46 contained therein. At least one protrusion 48 is provided on the wall of the cavity. A closed end 49 may be provided. A second superconducting wire 50 is embedded in a second block 52 of superconducting material. This second block is also of relatively complex shape, having an essentially cylindrical wall 54 which may have an essentially cylindrical cavity 56 contained therein, or may be solid. At least one protrusion 58 is provided on the wall 54. A closed end 59 may be provided. The second block is at least partially located within the cavity of the first block, such that respective protrusions (48, 58) overlap in a circumferential direction.

An actuator 60 may be provided on one or other, or both, of the first and second blocks 42, 52, for rotating one with respect to the other about an axis 62 aligned with the axes of the cylindrical walls of the first and second blocks. Preferably, the first block 42 has a number of protrusions 48 equal to the number of protrusions 58 on the second block.

The mechanical switch of this embodiment is actuated by relative rotation of the two blocks about axis 62. In the position illustrated, the two blocks are held apart, and are not in electrical contact. By driving one or other, or both, of the blocks with respect to each other about axis 62, at least one of the protrusions 58 on the second block is driven into mechanical and electrical contact with a corresponding protrusion 48 on the first block, placing the switch in its "on" position. By relative rotation about axis 62 in the opposite sense, the protrusions are separated from one another again and the switch enters its "off state". A vacuum or inert atmosphere is preferably provided around the blocks. The blocks may be driven about the axis 62 by any suitable means: electromechanical, mechanical, hydraulic, pneumatic or piezoelectric, for example.

Optionally, certain faces of the protrusions of one or both of the blocks 42, 52 may be covered with an electrically isolating layer. Accordingly, the blocks may be driven to the fullest extent about axis 62 in one direction to close the switch, and may be driven to the fullest extent in the opposite direction to open the switch, if electrically isolating layers are provided to prevent any contact between the protrusions of the two blocks when driven in this opposite direction.

Figure 7:
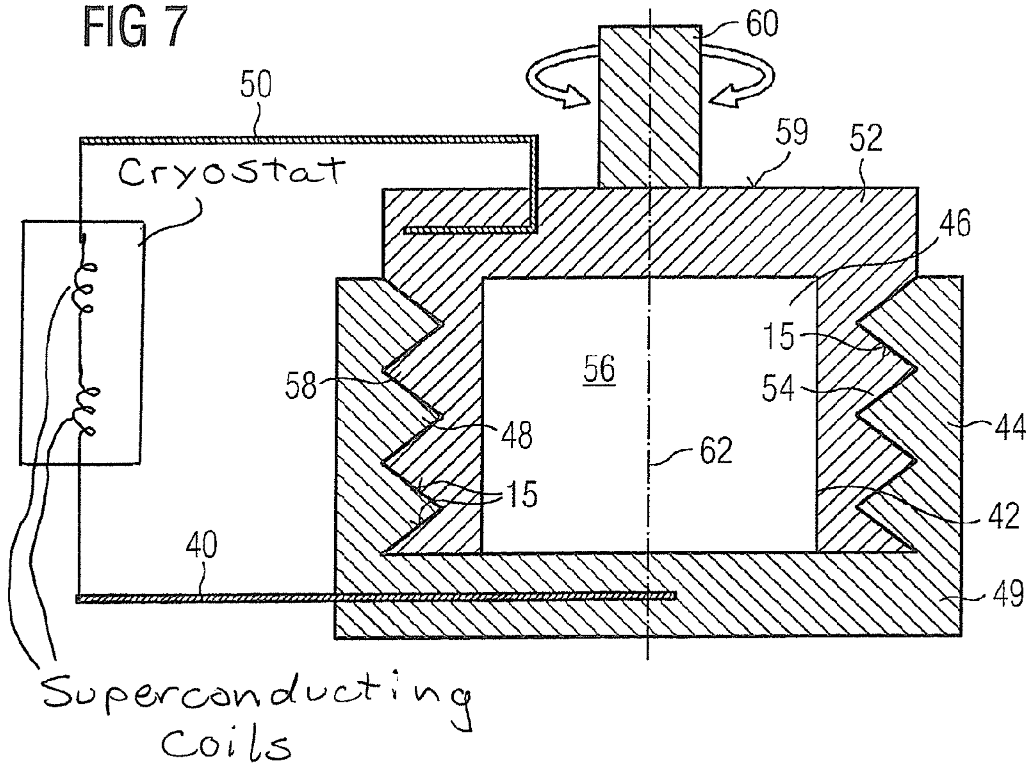

In an alternative arrangement, rather than protrusions 48, 58 running parallel to the axis 62, contact surfaces between first and second blocks may be provided by complementary thread surfaces of a helical or conical screw. FIG. 7 illustrates a cross-section along line VI-VI of an embodiment wherein the protrusions 48, 58 on first and second blocks are threaded. These thread surfaces are segmented to give make-break operation with limited rotation, similar to the operation discussed with reference to FIG. 6. The thread may be tapered to ensure limited rotation and tight fit between the two blocks in the embodiment illustrated in FIG. 7. Adjacent thread surfaces 15 may be brought to bear upon one another to provide electrical contact between the blocks, and the blocks may be rotated in the opposite relative direction to separate the blocks, and place the switch in its "off" state.

FIG. 7 also schematically illustrates that the first and second superconducting wires 40 and 50 are the ends of respective superconducting coils that are connected in series within a cryostat. FIG. 7 also shows the first and second superconducting wires 40 and 50 being cast into the superconducting blocks 49 and 52, respectively, as a result of the molding process described above.

Figure 8:
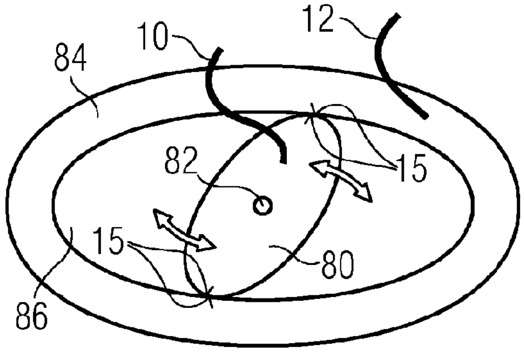
FIG. 8 schematically illustrates a further embodiment of a rotary-actuated mechanical superconducting switch according to the present invention.
Figure 9:
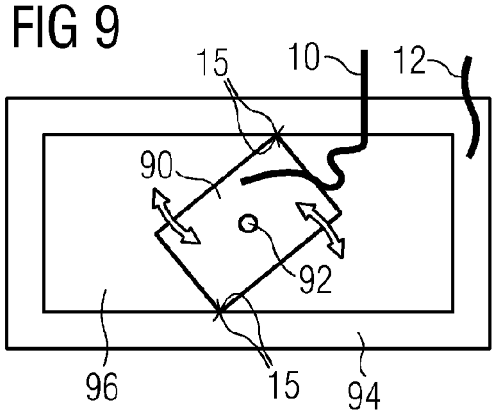
FIG. 9 schematically illustrates a further version of the embodiment of FIG. 8.

In another set of embodiments, such as illustrated in FIG. 8, first block 80 is arranged to rotate about an axis 82 defined within a cavity of second block 84. In this embodiment both block 80 and cavity 86 are elliptical in cross-section. By rotating block 80 about axis 82, surfaces 15 of the block and cavity may be brought into electrical contact and may be separated by rotation in the opposite direction. Other embodiments, such as shown in FIG. 9 operate in a similar manner. It is not necessary for the block in the cavity to be oval in cross-section. The embodiment of FIG. 9 shows an example in which both the block and the cavity have rectangular cross-sections and reference numerals 90, 92, 94 and 96 designate components corresponding to those designated by 80, 82, 84 and 86 in FIG. 8. Combinations of cross sections may be used, provided that the block has limited scope from rotation into and out of contact with the walls of the cavity.

Figure 10:
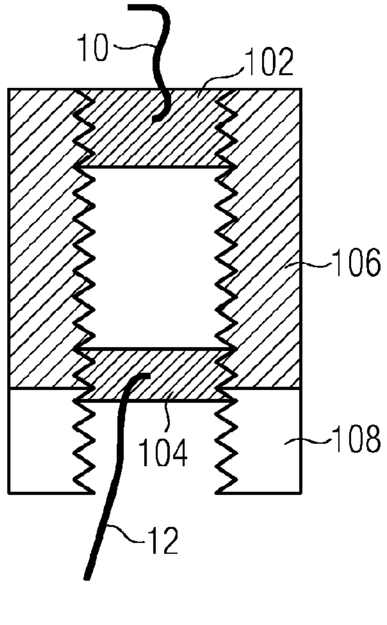
FIG. 10 schematically illustrates a further embodiment of the invention, wherein the blocks are stationary with respect to each other and a threaded superconducting collar is provided that is driven in and out of contact between the two blocks by relative rotation.

FIG. 10 shows an example of a further type of embodiment of the invention. Here, blocks 102, 104 remain stationary with respect to one another and a threaded superconducting collar 106 is provided and may be driven in and out of contact between the two blocks by relative rotation. Preferably an electrically isolating extension 108 is provided such that mechanical alignment is ensured when the collar is rotated out of electrical contact between the blocks. This embodiment is an example of another series of embodiments in which the blocks themselves do not move and a connecting superconducting article is moved into and out of contact between the two blocks. Variants of this embodiment will be apparent to those skilled in the art.

In certain embodiments, the improvements discussed with respect to FIGS. 3-5 may be applied. Contact surfaces 15 are shown in FIGS. 6-10, and these may be improved by the provision of frustoconical recesses and protrusions, as discussed with reference to FIG. 3, or part-spherical recesses and protrusions as discussed with reference to FIG. 4.

Particles or beads 140 of a relatively hard superconducting material may be included in one of the blocks 42, 52, as discussed with reference to FIG. 5. The very high pressure acting at the points of contact between particles or beads 140 and the other block ensures effective electrical contact. Other types of composite mixture of materials of different hardness may be used, to enable point contact deformation to occur.

During operation, additional mechanical actuation in the form of vibration may be applied to improve contact between the blocks of superconducting material.

To address the issue of possible high-voltage damage caused by switching a high current through a large inductive load using a mechanical switch, a suitable type of semiconductor based snubber is preferably provided to protect against damage.

In each case, the mechanical superconducting switch of the present invention is preferably cooled by the same cooling arrangement used to cool the magnet. Alternatively, a separate cooling arrangement may be provided to cool the switch.

Although modifications and changes may be suggested by those skilled in the art, it is the intention of the inventors to embody within the patent warranted heron all changes and modifications as reasonably and properly come within the scope of their contribution to the art.

We claim as our invention:

1. A mechanically operating superconducting switch comprising:

first and second superconducting wires;

first and second blocks each of superconducting material;

an end of said first superconducting wire being cast in said first block of superconducting material and an end of said second superconducting wire being cast in said second block of superconducting material;

each of said first and second blocks comprising a contact surface and the respective contact surfaces of said first and second blocks comprising complementary protrusions and recesses; and a mechanical rotary actuator connected to one of said first and second blocks, that closes said switch by rotating said one of said first and second blocks in a first rotary direction in order to drive the respective complementary protrusions and recesses of the respective contact surfaces into physical contact with each other, and that thereafter opens said switch by rotating said one of said first and second blocks in a second rotary direction, opposite to said first rotary direction, in order to separate the respective complementary protrusions and recesses of the respective contact surfaces.

2. A mechanically operating superconducting switch according to claim 1 wherein the first and second superconducting wires are, respectively, ends of coils forming a superconducting magnet.

3. A mechanically operating superconducting switch according to claim 1, wherein at least one of the first or second blocks is formed of superconducting material in which the corresponding first or second superconducting wire is embedded, the superconducting material of the at least one of the first or second blocks having a ductility greater than a ductility of superconducting material of the first or second superconducting wire embedded therein.

4. A mechanically operating superconducting switch according to claim 1, comprising a source of electronic control signals that control opening and closing of the switch.

5. A mechanically operating superconducting switch according to claim 1, wherein:

said first block has an essentially cylindrical wall with an essentially cylindrical cavity contained therein, with the protrusions of said first block being on a wall of the cavity;

said second block has an essentially cylindrical wall, with the protrusions of said second block being on the cylindrical wall of the second block;

the second block is at least partially located within the cavity of the first block, such that the protrusions of the first and second blocks overlap in a circumferential direction; and said rotary actuator rotates said one block of said first block and said second block with respect to the other around an axis aligned with axes of cylindrical walls of the first and second blocks.

6. A mechanically operating superconducting switch according to claim 5, wherein the first block has a number of first protrusions equal to the number of protrusions on the second block.

7. A mechanically operating superconducting switch according to claim 5, wherein at least some faces of the protrusions of one or both of the first block and the second block are covered with an electrically isolating layer.

8. A mechanically operating superconducting switch according to claim 5, wherein the protrusions of the first and second blocks are parallel to said axis.

9. A mechanically operating superconducting switch according to claim 5, wherein the protrusions of the first and second blocks are formed as complementary thread surfaces of a helical or conical screw.

10. A mechanically operating superconducting switch according to claim 9, wherein the thread surfaces are segmented.

11. A mechanically operating superconducting switch according to claim 1, comprising a vacuum or inert atmosphere around the first and second blocks.

12. A mechanically operating superconducting switch according claim 1, comprising arrangements for additional mechanical vibration actuation of the first and second blocks.

13. A superconducting magnet structure comprising:

a mechanically operating superconducting switch;

a plurality of coils of superconducting wire electrically connected in series, housed within a cryostat arranged to cool the coils, and wherein first and second superconducting wires from respective electrical ends of the coils are connected to said mechanically operating superconducting switch; and said mechanically operating superconducting switch comprising first and second blocks of superconducting material with an end of said first wire cast in said first block and an end of said second wire cast in said second block, each of said first and second blocks comprising a contact surface and the respective contact surfaces of said first and second blocks comprising complementary protrusions and recesses, and a mechanical rotary actuator connected to one of said first and second blocks that closes said switch by rotating said one of said first and second blocks in a first rotary direction in order to drive the respective complementary protrusions and recesses of the respective contact surfaces into physical contact with each other, and that thereafter opens said switch by rotating said one of said first and second blocks in a second rotary direction, opposite to said first rotary direction in order to separate the respective complementary protrusions and recesses of the respective contact surfaces.

14. A superconducting magnet structure according to claim 13 wherein the switch is within the cryostat, and comprising a source of electronic control signals that control opening and closing of the switch, said source of electronic control signals being outside the cryostat.

15. A superconducting magnet structure according to claim 13 wherein the mechanical superconducting switch is cooled by a same cooling arrangement used to cool the magnet.

* * * * *